United States Patent [19]
Suzuki

[11] Patent Number: 5,510,956
[45] Date of Patent: Apr. 23, 1996

[54] ELECTRONIC PART UNIT OR ASSEMBLY HAVING A PLURALITY OF ELECTRONIC PARTS ENCLOSED WITHIN A METAL ENCLOSURE MEMBER MOUNTED ON A WIRING LAYER

[75] Inventor: Masakazu Suzuki, Kawasaki, Japan

[73] Assignee: Fujitsu Limited, Kawasaki, Japan

[21] Appl. No.: 277,205

[22] Filed: Jul. 19, 1994

[30] Foreign Application Priority Data

Nov. 24, 1993 [JP] Japan .................................. 5-293532

[51] Int. Cl.6 .................................................. H05K 7/20
[52] U.S. Cl. ........................ 361/704; 174/16.3; 257/707; 257/713; 257/796
[58] Field of Search .......................... 174/16.3; 257/707, 257/710, 712–713, 726–727, 718–719, 787–789, 791, 796; 361/690, 704–722

[56] References Cited

U.S. PATENT DOCUMENTS 4,620,215  10/1986  Lee ........................................... 257/796
4,970,575  11/1990  Soga et al. ............................. 257/796
5,371,404  12/1994  Juskey et al. ........................... 257/796

*Primary Examiner*—Gregory D. Thompson
*Attorney, Agent, or Firm*—Armstrong, Westerman, Hattori, McLeland & Naughton

[57] ABSTRACT

An electronic part unit which is superior in heat radiation and airtightness. The electronic part unit comprises a unit circuit board having a wiring pattern formed on a surface thereof, an electronic part mounted on the wiring pattern of the unit circuit board, a resin enclosure member for covering over a surface of the wiring pattern of the unit circuit board with the electronic part partially exposed outside, and a metal enclosure member for covering over the exposed portion of the electronic part, a surface of the resin enclosure member and the unit circuit board. The unit circuit board has a metal pad formed integrally over the entire periphery on the surface in the proximity of the outer periphery thereof, and the metal enclosure member is joined integrally to the metal pad.

3 Claims, 6 Drawing Sheets

ELECTRONIC PART UNIT OR ASSEMBLY HAVING A PLURALITY OF ELECTRONIC PARTS ENCLOSED WITHIN A METAL ENCLOSURE MEMBER MOUNTED ON A WIRING LAYER

BACKGROUND OF THE INVENTION

1. Field of the Invention

This invention relates to an electronic part unit or assembly constructed from a plurality of electronic parts mounted on a unit circuit board and a process of manufacturing the same.

2. Description of the Related Art

In such apparatus as electronic computers, a structure wherein electronic part units each constructed from a plurality of electronic parts such as LSIs (bare chips) mounted on a unit circuit board are mounted on a printed circuit board or a like board together with other electronic parts or like parts is employed. Such electronic part units are required to be improved in heat radiation and airtightness.

FIG. 1 is a sectional view showing the construction of a prior art. Referring to FIG. 1, reference numeral 1 denotes a unit circuit board formed from ceramics or a like material. A resin wiring layer 2 made of polyimide or a like material and having a wiring pattern is formed on the front surface of the unit circuit board 1. A plurality of IO pins 3 are provided in an array on the rear surface of the unit circuit board 1 and electrically connected suitably to the wiring pattern. Reference numeral 4 denotes a bare chip part such as an LSI. The bare chip parts 4 are mounted on the wiring layer 2 by connecting them to the wiring pattern of the wiring layer 2 by means of solder bumps 5. The bare chips 4 are covered in an airtight enclosed condition with a resin enclosure member 6 made of an epoxy resin material or a silicon resin material (potting agent).

The prior art, however, is disadvantageous in that, since electronic parts are entirely covered with a resin material which cannot, due to its high heat resistance, radiate heat generated from such electronic parts mounted on a unit circuit board, a malfunction or a damage to the circuitry is often caused by the heat. Also there is another disadvantage in that, since an outer periphery of a resin wiring layer is exposed to the external air, water or some other foreign substance likely enters the resin wiring layer and causes a trouble such as deterioration of the insulation.

SUMMARY OF THE INVENTION

It is therefore an object of the present invention to provide an electronic part unit which is superior in heat radiation and airtightness.

It is another object of the present invention to provide a process of manufacturing an electronic part unit which is superior in heat radiation and air tightness.

In accordance with an aspect of the present invention, there is provided an electronic part unit, which comprises a unit circuit board having a wiring pattern formed on a surface thereof, an electronic part mounted on the wiring pattern of the unit circuit board, a resin enclosure member for covering over a surface of the wiring pattern of the unit circuit board with the electronic part partially exposed outside, and a metal enclosure member for covering over the exposed portion of the electronic part, a surface of the resin enclosure member and the unit circuit board.

The unit circuit board has a metal pad formed integrally over the entire periphery on the surface in the proximity of the outer periphery thereof, and the metal enclosure member is joined integrally to the metal pad.

In accordance with another aspect of the present invention, there is provided a process of manufacturing an electronic part unit, which comprises the steps of preparing a unit circuit board having a wiring pattern formed on a surface thereof and having a metal pad formed integrally over the entire periphery on the surface in the proximity of the outer periphery thereof, mounting an electronic part onto the wiring pattern of the unit circuit board, covering a surface of the wiring pattern of the unit circuit board such that the electronic part is partially exposed outside, forming a dam along the entire periphery on the surface of the unit circuit board outside the petal pad, filling a molten low melting point metal material into the inside of the dam, and removing the dam after the low melting point metal material is cooled and hardened.

According to the present invention, the metal enclosure member is held in direct contact with the electronic part, and heat generated from the electronic part is radiated to the outside by way of the metal enclosure member which has a low heat resistance. Consequently, an electronic part which is high in heat radiation efficiency and is less liable to suffer from a malfunction or damage to the circuitry caused by heat can be provided. Since the resin enclosure member is present in the proximity of the connection portion between the electronic part and the wiring layer, no trouble will arise with the insulation at the connection portion. Further, since the metal enclosure member is joined integrally to the metal pad on the unit circuit board, sufficient airtightness can be achieved.

The above and other objects, features and advantages of the present invention and the manner of realizing them will become more apparent, and the invention itself will best be understood, from a study of the following description and appended claims with reference to the attached drawings showing some preferred embodiments of the invention.

BRIEF DESCRIPTION OF THE DRAWINGS

FIGS. 2A and 2B to FIGS. 5A and 5B are views showing different steps of a manufacturing process of an embodiment of the present invention and wherein FIGS. 2A to 5A are sectional views of the embodiment and FIGS. 2B to 5B are plan views of the embodiment;

DESCRIPTION OF THE PREFERRED EMBODIMENTS

Figure 1:
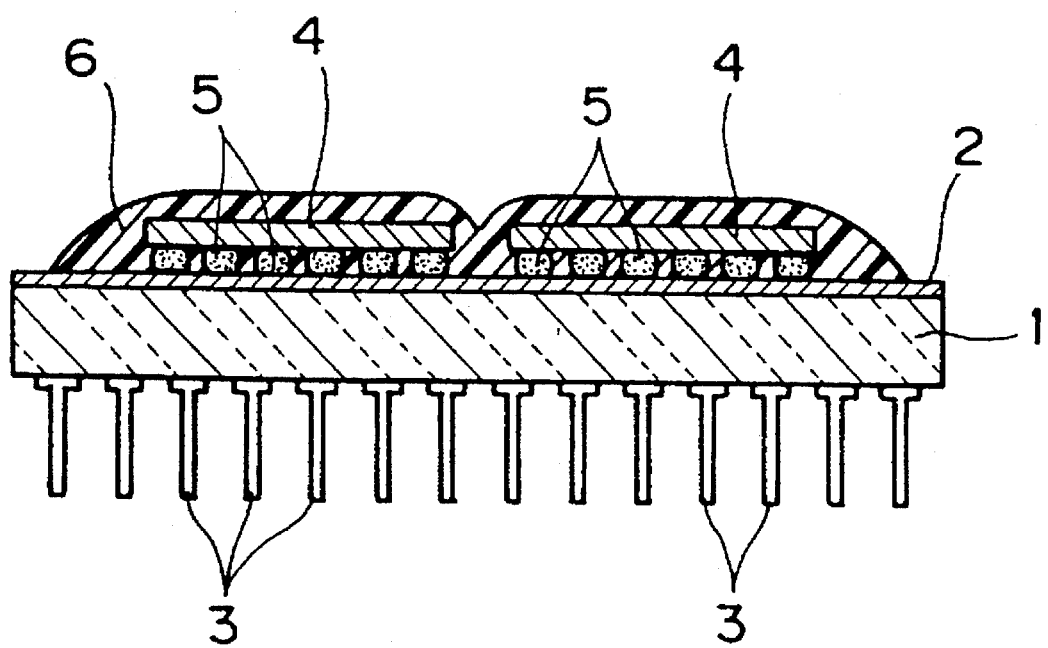
FIG. 1 is a sectional view showing the construction of the prior art.
Figure 2A:
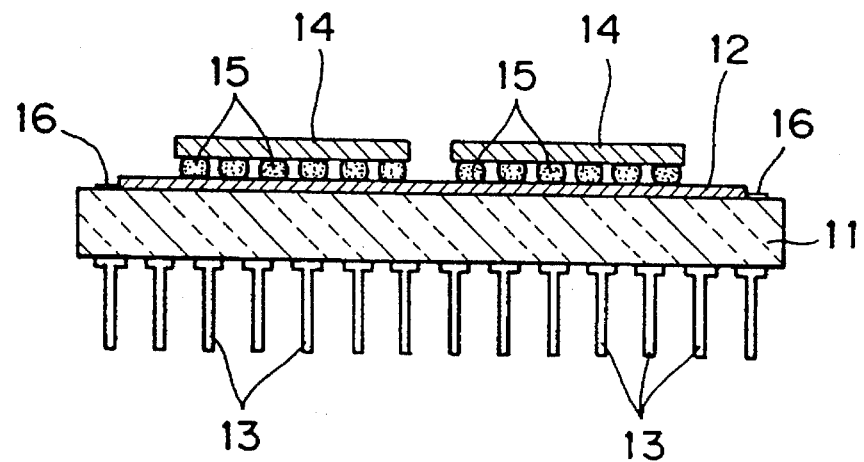
Figure 2B:
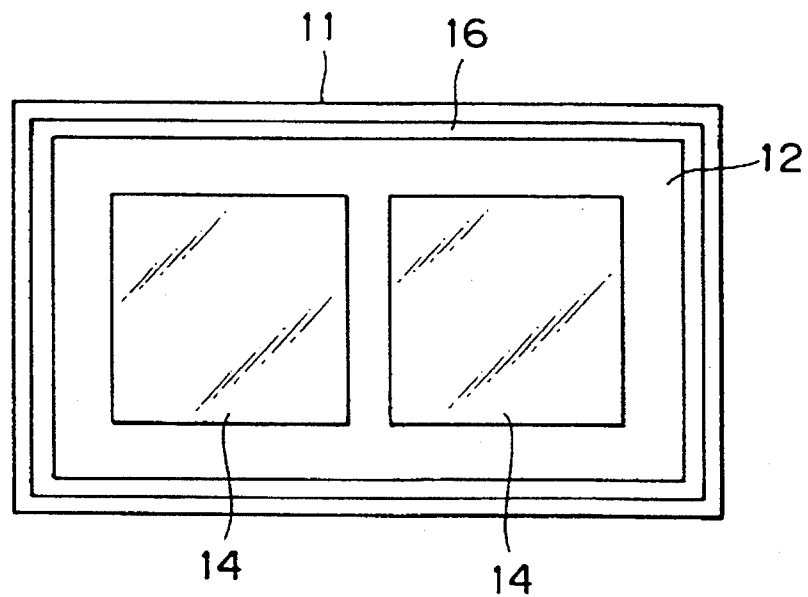

FIGS. 2A and 2B to FIGS. 5A and 5B show different steps of a process of manufacturing an electronic part unit (multi-chip module) of an embodiment of the present invention, and wherein FIGS. 2A to 5A are sectional views and FIGS. 2B to 5B are plan views. Referring first to FIGS. 2A and 2B, reference numeral 11 denotes a unit circuit board made of ceramics or a like material. A thin film wiring layer 12 made of polyimide or a like material and having a wiring pattern is formed on the front surface of the unit circuit board 11. A plurality of IO pins 13 are provided in an array on the rear surface of the unit circuit board 11 and suitably connected to the wiring pattern.

Reference numeral 14 denotes a bare chip part such as an LSI. Terminals of the bare chip parts 14 are connected to the wiring pattern of the thin film wiring layer 12 by means of solder bumps 15 to mount the bare chip parts 14 on the thin film wiring layer 12. A metal pad (metal thin film) 16 is formed uniformly over the entire periphery of the unit circuit board 11 in the proximity of the outer periphery of the thin film wiring layer 12. The metal pad 16 is formed directly on the unit circuit board (ceramic plate) 11 by vapor deposition or plating of a metal material having solder wettability.

Figure 3A:
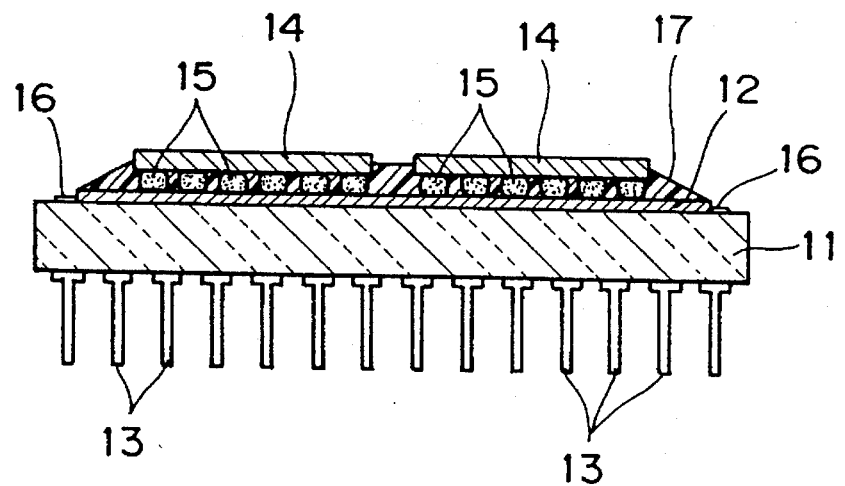
Figure 3B:
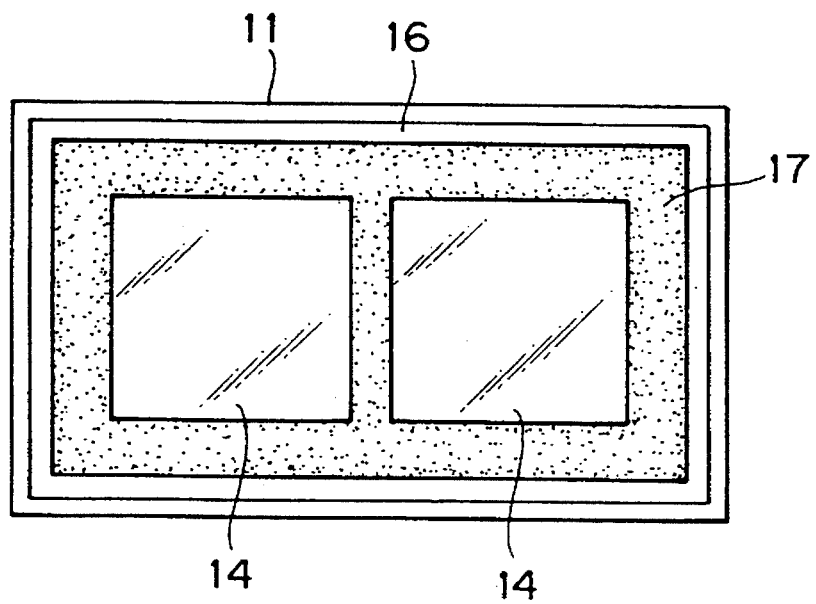

In this condition, the surface of the thin film wiring layer 12 including the bare chip parts 14 is covered with a resin enclosure member 17 made of an epoxy resin material or a silicon resin material (potting agent) with the surfaces of the bear chip parts 14 partially exposed to the outside as shown in FIGS. 3A and 3B so that the thin film wiring layer 12 and connection portions between the thin film wiring layer 12 and the bare chip parts 14 are protected in an insulated condition.

Figure 4A:
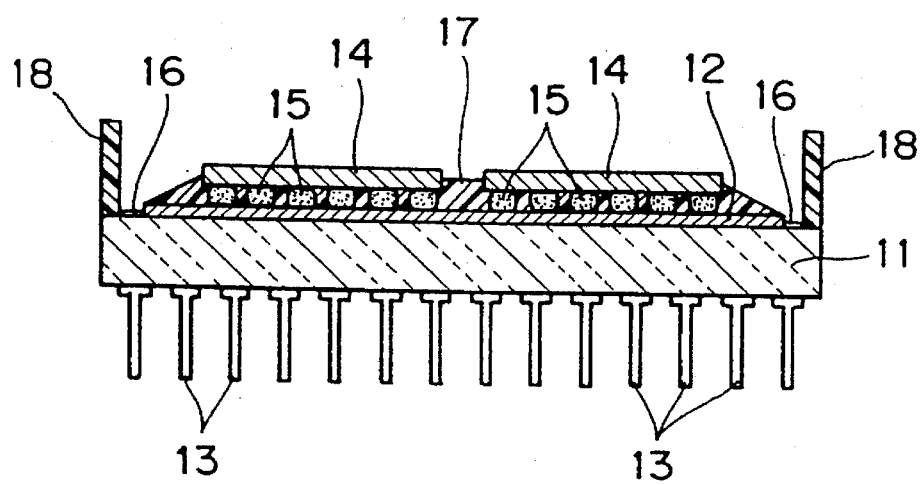
Figure 4B:
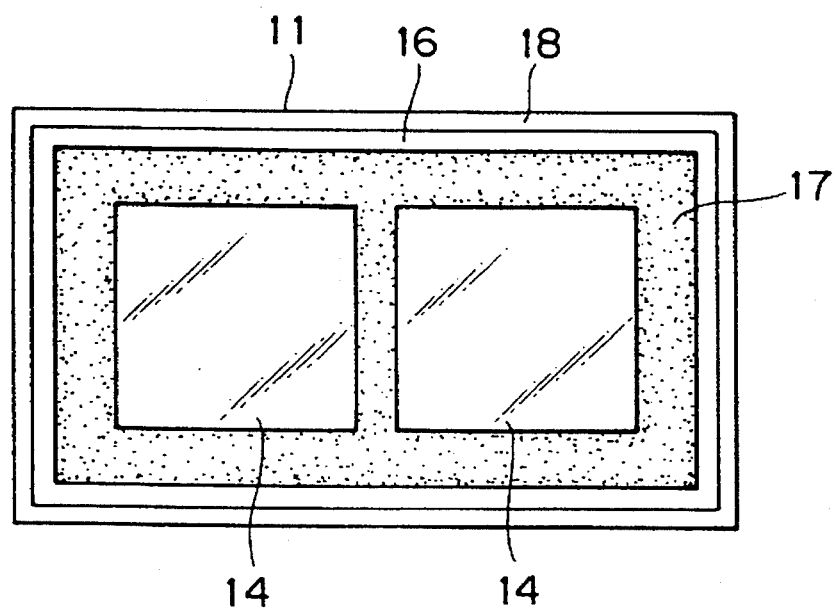
Figure 5A:
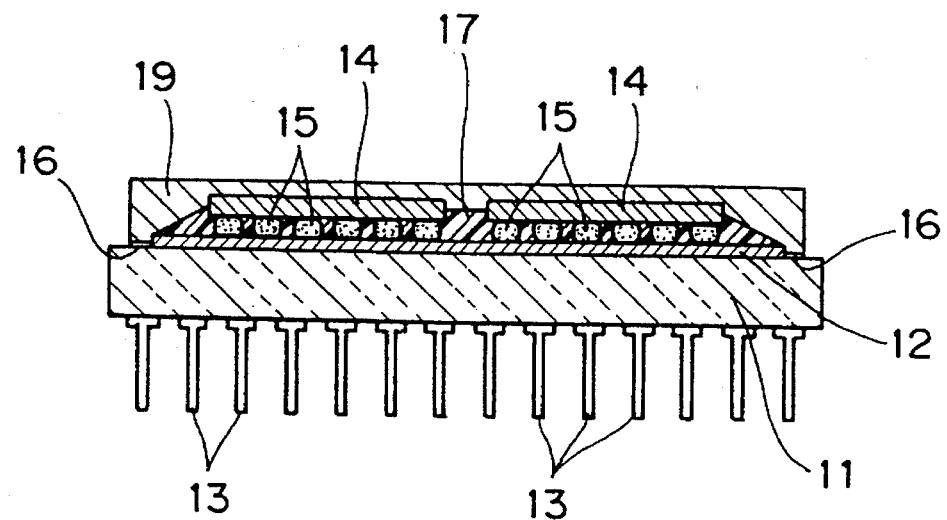
Figure 5B:
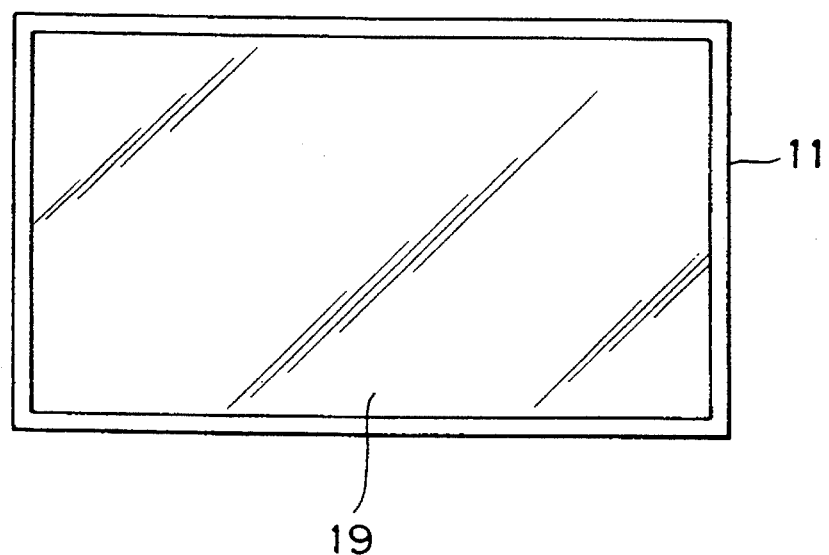

Subsequently, an outflow prevention dam 18 made of, for example, a heat resisting resin material is mounted over the entire periphery of the unit circuit board 11 in the proximity of the outer periphery of the metal pad 16 on the surface of the unit circuit board 11, that is, in the proximity of the outer periphery of the unit circuit board 11 as shown in FIGS. 4A and 4B. The outflow prevention dam 18 is set in height thereof so that it may be sufficiently higher than a most highest portion of the bare chip parts 14. Then, solder (a metal material having a low melting point) heated into a molten condition is flowed into the space inside the outflow prevention dam 18. The solder is filled to a height sufficient to bury the bare chip parts 14 therein. Then, after the molten solder becomes hardened, the outflow prevention dam 18 is removed leaving a metal enclosure member 19 of the solder as shown in FIGS. 5A and 5B.

According to the present embodiment, since the metal pad 16 on the unit circuit board 11 has solder wettability, the metal enclosure member 19 is joined integrally to the metal pad 16, and accordingly, the airtightness is high. Further, since the thin film wiring layer 12 is not exposed to the outside, admission of water or some other foreign substance is not allowed at all, and consequently, such a trouble as degradation of insulation is not caused. Meanwhile, from a point of view of heat, since the surfaces of the bare chip parts 14 are enclosed not in a resin but in a metal (solder) having a very low heat resistance, heat of the bare chip parts 14 is radiated to the outside by way of the metal enclosure member 19, and consequently, a malfunction or damage to the circuitry caused by heat of the bare chip parts is reduced. It is to be noted that the electronic part unit is mounted on a mother board (printed circuit board) together with other electronic parts, and an electronic apparatus such as an electronic computer is constituted partly from the mother board and so forth.

Figure 6A:
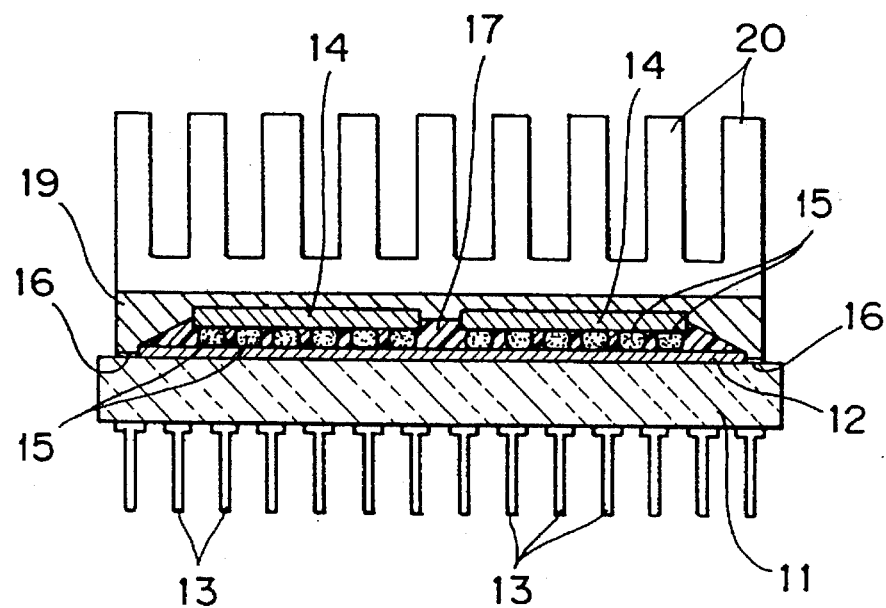
FIG. 6A is a sectional view of another embodiment of the present invention.
Figure 6B:
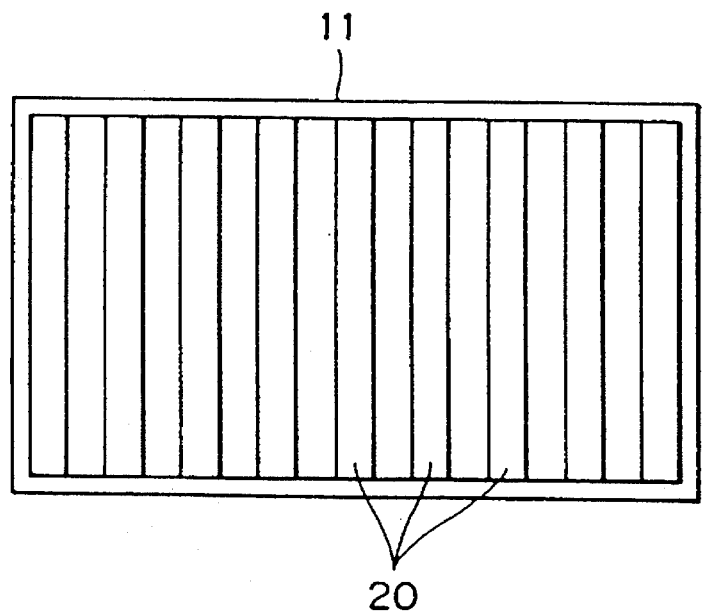
FIG. 6B is a plan view of the embodiment shown in FIG. 6A.

FIGS. 6A and 6B are a sectional view and a plan view showing the construction of another embodiment of the present invention. Substantially same components to those of the embodiment described above are denoted by same reference numerals, and overlapping description thereof is omitted herein. In the present embodiment, heat radiation fins 20 are mounted on the surface of the metal enclosure member 19. Heat generated from the bare chip parts 14 is transmitted to the heat radiation fins 20 by way of the metal enclosure member 19 and then positively radiated from the heat radiation fins 20 to the external space. Consequently, the heat radiation is improved remarkably.

In order to mount the heat radiation fins 20, the heat radiation fins 20 are made of a metal material having solder wettability, and in the condition shown in FIGS. 4A and 4B wherein molten solder is flowed in the inside of the outflow prevention dam 18, the heat radiation fins 20 are closely contacted with the molten solder and held in this condition until the solder becomes hardened to join the heat radiation fins 20 integrally to the solder. On the other hand, where the heat radiation fins 20 are formed from a material having no or little solder wettability, protrusions such as screws are disposed on the bottom faces of the heat radiation fins 20 and are inserted into the molten solder so that, after the solder becomes hardened, the heat radiation fins 20 are joined integrally to the solder.

What is claimed is:

1. An electronic part unit, comprising:

a unit circuit board having a wiring pattern formed on a surface thereof;

an electronic part mounted on said wiring pattern of said unit circuit board;

a resin enclosure member for covering over a surface of said wiring pattern of said unit circuit board with said electronic part partially exposed outside; and a metal enclosure member for covering over the exposed portion of said electronic part, a surface of said resin enclosure member and said unit circuit board, wherein said unit circuit board has a metal pad integrally formed over the entire periphery on the surface proximate the outer periphery of said unit circuit board, and wherein said metal enclosure member is integrally coupled to said metal pad.

2. An electronic part unit according to claim 1, further comprising a heat radiation member joined to said metal enclosure member.

3. An electronic part unit according to claim 1, wherein said metal enclosure member is made of solder.

\* \* \* \* \*